US007660131B2

(12) United States Patent
Drouillard et al.

(10) Patent No.: US 7,660,131 B2
(45) Date of Patent: Feb. 9, 2010

(54) INTEGRAL SATA INTERFACE

(75) Inventors: Mark Joseph Drouillard, Longmont, CO (US); Jason Allen Sorrell, Aurora, CO (US); Clifford S. Fernalld, Jr., Estes Park, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 44 days.

(21) Appl. No.: 11/848,281

(22) Filed: Aug. 31, 2007

(65) Prior Publication Data

US 2009/0063746 A1 Mar. 5, 2009

(51) Int. Cl.
*H05K 1/11* (2006.01)

(52) U.S. Cl. ...................................... 361/784; 361/749

(58) Field of Classification Search ................. 361/784, 361/749; 712/38; 360/245
See application file for complete search history.

(56) References Cited

U.S. PATENT DOCUMENTS 5,379,439 A * 1/1995 Harrison et al. ............ 360/72.1
5,692,910 A 12/1997 Mittal
5,751,553 A * 5/1998 Clayton ...................... 361/749
6,007,359 A 12/1999 Kosmala
6,231,363 B1 5/2001 Kosmala
6,241,534 B1 * 6/2001 Neer et al. ................. 439/76.1
6,764,344 B2 * 7/2004 Maiers ....................... 439/629
6,884,085 B1 4/2005 Goldstone
6,908,330 B2 6/2005 Garrett et al.
7,160,117 B2 * 1/2007 Ngo .......................... 439/76.1
7,189,121 B1 3/2007 Ko
2005/0026472 A1 2/2005 Lee et al.
2008/0168257 A1 * 7/2008 Marks et al. ................. 712/38

OTHER PUBLICATIONS

Dell Computer Corp. et al., Serial ATA International Organization: Serial ATA Revision 2.5, pp. 1-587, Oct. 27, 2005.

* cited by examiner

*Primary Examiner*—Jinhee J Lee
*Assistant Examiner*—Andargie M Aychillhum
(74) *Attorney, Agent, or Firm*—Leanne Taveggia Farrell; Westman, Champlin & Kelly, P.A.

(57) ABSTRACT

An interface couples a host device and a peripheral device. The interface includes at least one tab integrally formed and extending from a main body of a printed circuit board. The at least one tab has a plurality of contact pads. The interface also includes at least one keying feature integrally formed with an enclosure of the peripheral device. The at least one keying feature configured to guide a receptacle connector of the host device into connection with the plurality of contact pads on the at least one tab.

20 Claims, 5 Drawing Sheets

INTEGRAL SATA INTERFACE

BACKGROUND

Some types of host devices include a central processor unit having one or more data storage devices. A typical data storage device includes a rigid housing having a base and top cover that form an enclosure for housing a variety of data storage components. Often, a printed circuit board (PCB) is mounted directly to the enclosure of the data storage housing and electrically communicates with and operates the data storage device.

Data is transferred between the host device and the data storage device by way of an interface. Data to be written to the data storage device is passed from the host device to the data storage device via the interface. Vice versa, data read from the data storage device is passed from the data storage device to the host device via the interface. In general, the interface includes hardware and/or software that manages and regulates the transmission of data between the data storage device and the host device. A standard committee, such as the American National Standard Institute (ANSI), oversees the adoption of interface protocols such that peripheral devices (for example a data storage device) follow a common standard that can be used interchangeably with a variety of different host devices.

One widely used interface standard for interfaces between data storage devices and host devices include the Advanced Technology Attachment (ATA) standard. A previous ATA standard was known as the parallel ATA (PATA) interconnect standard. PATA has been widely used to interconnect data storage devices with host devices for over 20 years. However, PATA has a number of limitations that are exhausting its ability to continue increasing performance demands of ever changing data storage devices and host devices. The limitations of the PATA interface has recently led to the development of a new ATA specification known as a serial ATA (SATA) interconnect standard. One of many of the details of the SATA specification includes standard geometric dimensions for a SATA electrical connector coupleable to a PCB. The SATA electrical connector acts as the SATA interface between the data storage device and the host device.

A SATA electrical connector includes a housing that houses contact leads and contact pads for data transfer as well as power transfer. The contact leads are coupleable to contact pads on the PCB with solder joints. The contact pads are coupleable to a receptacle connector of the host device. The housing both protects the contact leads that are soldered to contact pads of the PCB as well as provides features for mating the electrical connector coupled to the PCB with the receptacle connector of the host device.

Although SATA electrical connectors are an improvement over PATA electrical connectors, a SATA electrical connector soldered to a PCB can lose signal integrity as well as can experience electromagnetic interference (EMI) at high data transfer frequencies. In addition, signal impedance is a common problem in SATA electrical connectors because of the solder joint connection between the contact leads of the electrical connector and the contact pads of the PCB.

SUMMARY

An interface provided that couples a host device and a peripheral device. The interface includes at least one tab integrally formed and extending from a main body of a printed circuit board, which is included in the peripheral device. The at least one tab has a plurality of contact pads. In particular, the peripheral device is an electronic device that includes the printed circuit board mounted and coupled to an enclosure. The enclosure houses components of the electronic device. The interface also includes at least one keying feature integrally formed with the enclosure of the peripheral device. The at least one keying feature is configured to guide a receptacle connector of the host device into connection with the plurality of contact pads on the at least one tab.

These and various other features and advantages will be apparent from a reading of the following Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

DETAILED DESCRIPTION

Embodiments described in the following detailed description are directed towards a data storage device that is coupled for communication and power to a host device via a Serial Advanced Attachment (SATA) interface. However, it should be realized that embodiments described in the detailed description can be used in other types of peripheral devices other than data storage devices. In addition, embodiments described in the detailed description can be used with other types of interfaces that can be used between a peripheral device and a host device other than a SATA interface. For example, other types of Advanced Technology Attachment (ATA) interfaces should be considered.

Figure 1:
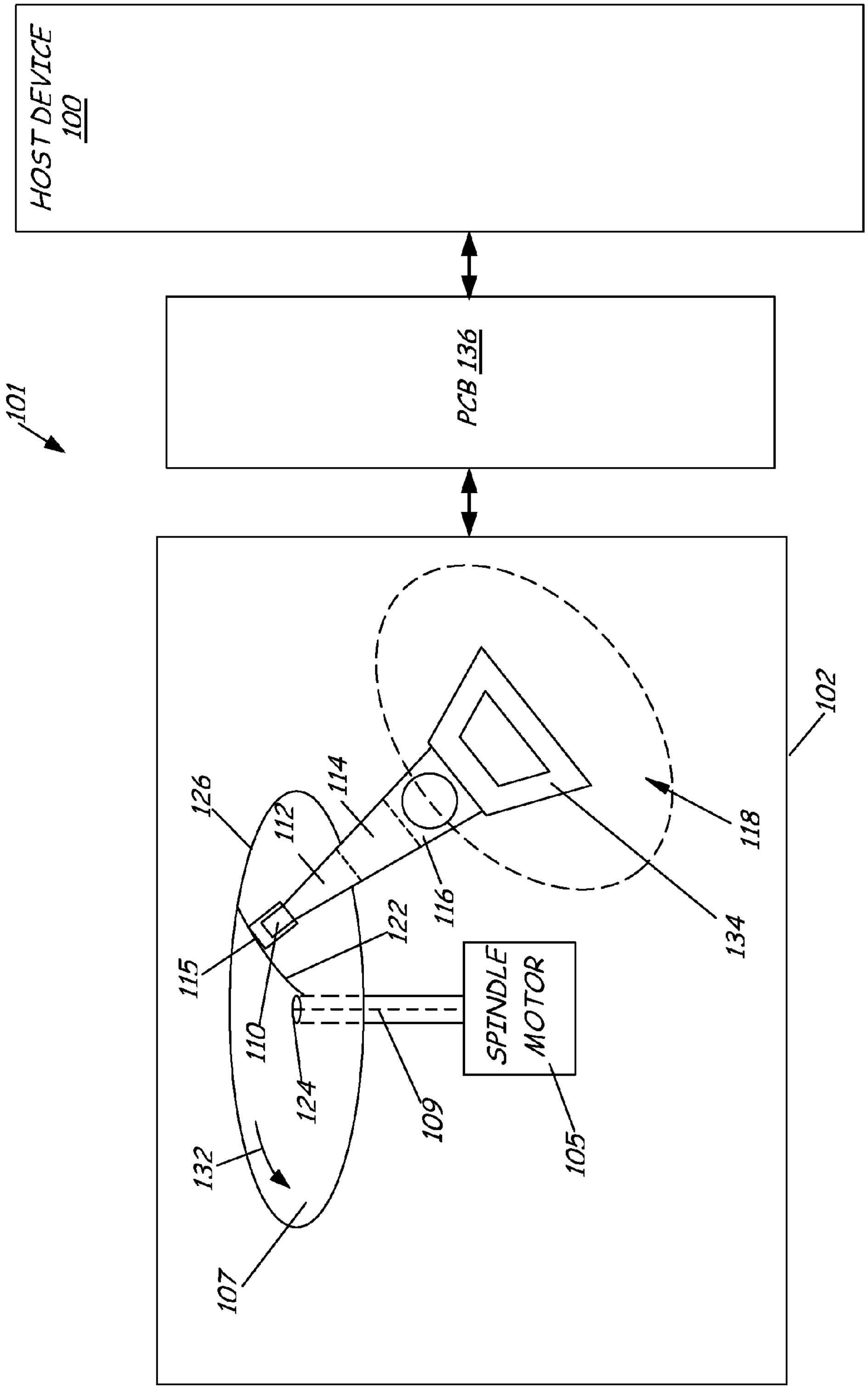
FIG. 1 is a simplified schematic diagram of a host device coupled to a data storage device.

FIG. 1 is a simplified schematic diagram of a host device 100 coupled to a data storage device 101 through a printed circuit board (PCB) 136 under one embodiment. A disc drive is a common type of data storage device. Data storage device 101 includes an enclosure 102. Data storage device 101 further includes a medium 107. Those skilled in the art should recognize that data storage device 101 can contain a single medium, as illustrated in FIG. 1, or multiple media. As illustrated in FIG. 1, medium 107 is mounted on a spindle motor 105 for rotation about central axis 109. Each surface of the medium 107 has an associated slider 110. Each slider 110 carries a read/write head for communication with the surface on the medium 107.

Each slider 110 is supported by a suspension 112 which is in turn attached to a track accessing arm 114 of an actuator mechanism 116. Actuator mechanism 116 is rotated about a shaft by a voice coil 134 of a voice coil motor 118. As voice coil motor 118 rotates actuator mechanism 116, slider 110 moves in an arcuate path 122 between a medium inner diameter 124 and a medium outer diameter 126. While FIG. 1 illustrates one manner of actuating a data head proximate a data storage medium, the present invention, however, is applicable to data storage systems that use other techniques.

Data storage device 101 includes printed circuit board (PCB) 136. PCB 136 is located outside enclosure 102. In general, PCB 136 is mounted and coupled to an outer surface of enclosure 102. PCB 136 supports a plurality of printed circuit board components (not shown in FIG. 1). The printed circuit board components are configured to electrically couple to components enclosed within enclosure 102, such as spindle motor 105, slider 110, actuator mechanism 116 and voice coil motor 118. PCB 136 is also coupled to host device 100 via an electrical interface. The electrical interface provides for data transfer between data storage device 101 and host device 100 as well as a power input from host device 100.

Figure 2:
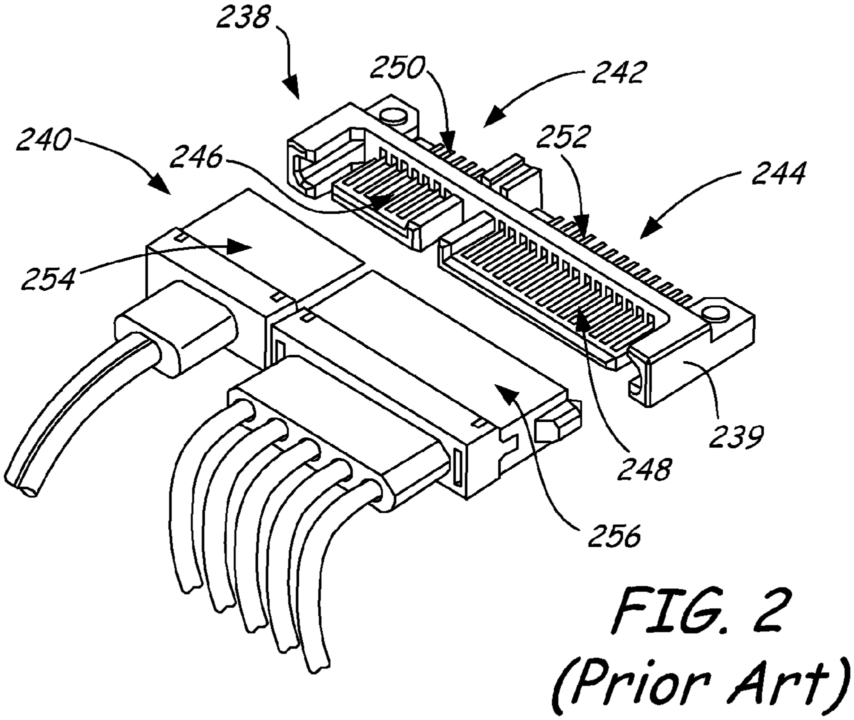
FIG. 2 (Prior Art)
FIG. 2 illustrates a perspective view of a prior art SATA receptacle connector exploded from a prior art SATA connector.

FIG. 2 illustrates a perspective view of a Serial Advanced Technology Attachment (SATA) plug connector 238 exploded from a SATA receptacle connector 240 in accordance with the prior art. SATA plug connector 238, which complies with the SATA specification provided by the Serial ATA International Organization, can be used as the interface between a SATA receptacle connector 240 configured for coupling to a host device, such as host device 100, and a data storage device, such as data storage device 101. SATA plug connector 238 is configured for coupling to a PCB, such as PCB 136. SATA receptacle connector 240, which also complies with the SATA specification, is configured for coupling to a host device, such as host device 100.

Figure 3:
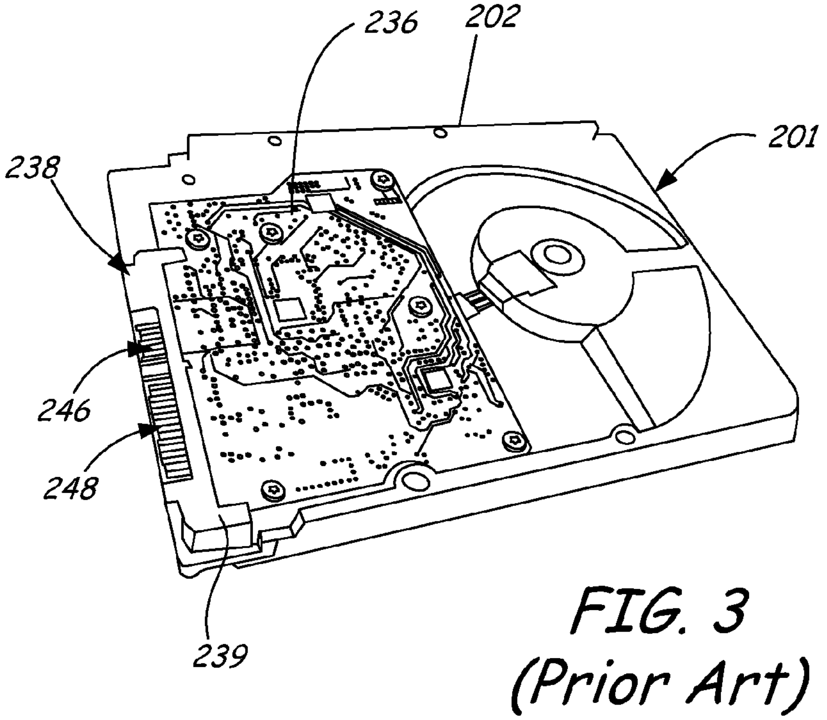
FIG. 3 (Prior Art)
FIG. 3 is a perspective view of a prior art SATA connector coupled to a printed circuit board (PCB) that is mounted to a data storage device.

SATA plug connector 238 includes a housing 239 that houses a device signal plug connector 242 and a device power plug connector 244. The device signal plug connector 242 is of different dimension than device power plug connector 242. Both device plug connectors 242 and 244 have contact pads 246 and 248, respectively as well as contact leads 250 and 252, respectively. Contact leads 250 and 252 extend from contact pads 246 and 248 for coupling to a PCB, such as PCB 136. In general, plug connector 238, that includes device plug connectors 242 and 244, is mounted to the PCB and contact leads 250 and 252 are soldered to contact pads on the PCB. FIG. 3 illustrates a perspective view of SATA plug connector 238 mounted and coupled to a PCB 236 in accordance with the prior art. PCB 236 is coupled to an enclosure 202 of a data storage device 201. Housing 239 as well as contact pads 246 and 248 of SATA plug connector 238 are illustrated.

Referring back to FIG. 2, SATA receptacle connector 240 includes a signal cable receptacle connector 254 and a power cable receptacle connector 256. Signal cable receptacle connector 254 includes dimensions and components that matingly correspond with contact pads 246 of device signal plug connector 242 and housing 239. Power cable receptacle connector 256 includes dimensions and components that matingly correspond with contact pads 248 of device power plug connector 244 and housing 239. In one alternative, a SATA receptacle connector can be in the form of a backplane connector. A back plane connector includes a device power plug connector and that includes a signal cable receptacle connector and a power cable receptacle connector that are of a single housing. Receptacle connector 240 illustrated in FIG. 2 can include signal cable receptacle connector 254 and power cable receptacle connector 256 that have separate housings.

Figure 4:
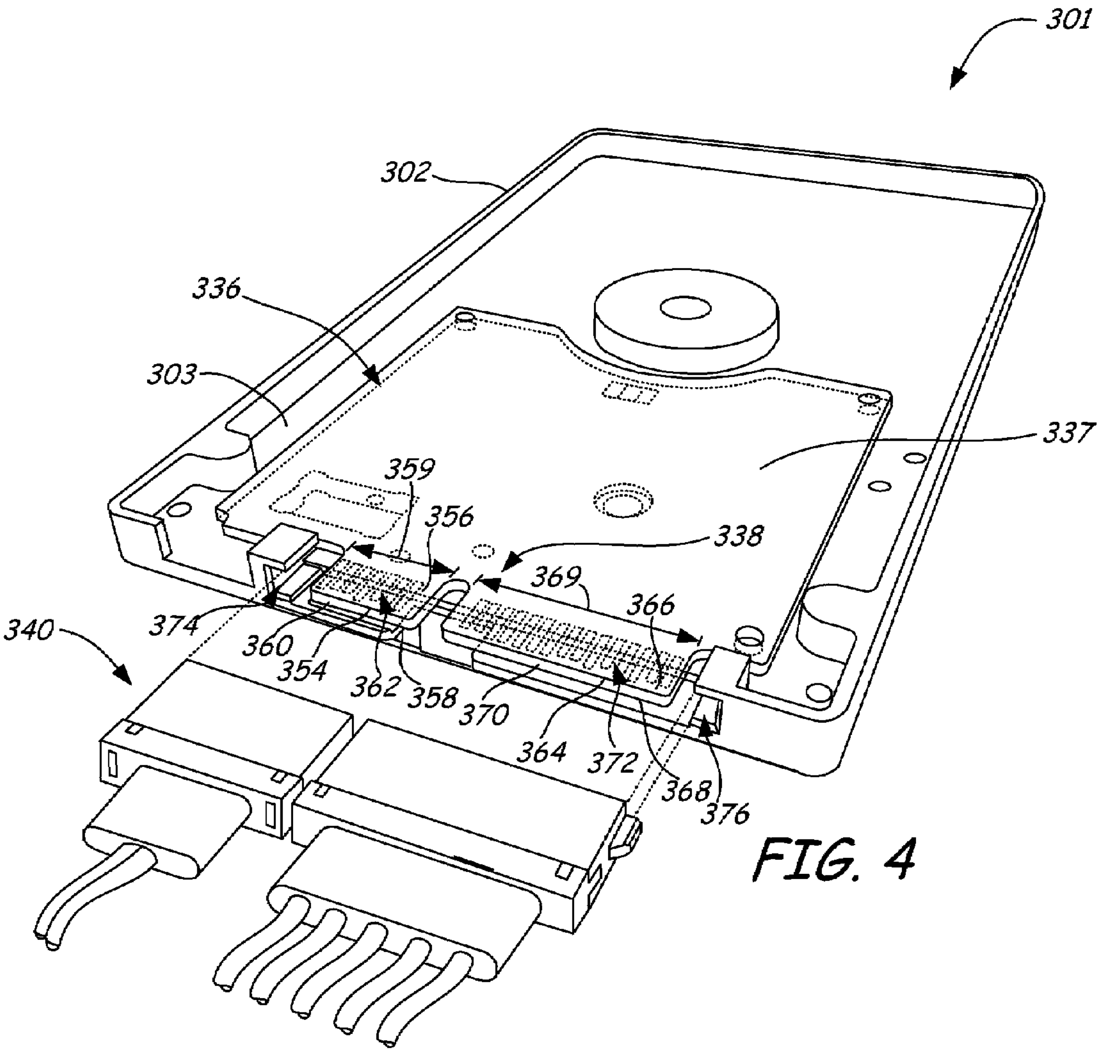
FIG. 4 is a perspective view of a data storage device having a SATA interface and a SATA receptacle connector under one embodiment.

FIG. 4 illustrates a perspective view of a data storage device 301 and a SATA receptacle connector 340 exploded from a SATA interface 338 formed with data storage device 301 under one embodiment. It should be understood that SATA receptacle connector 340 can have a different configuration than that which is shown in FIG. 4. For example, SATA receptacle connector 340 can be configured as a backplane receptacle connector as discussed above in regards to FIG. 2. Data storage device 301 is one example of a peripheral device that is configured for use with a host device. Instead of utilizing a SATA plug connector (illustrated in FIG. 2) as an interface between a host device and a peripheral device, embodiments include a SATA interface 338 integrally formed with data storage device 301. By eliminating the need for a SATA connector, a significant reduction in cost can be realized.

SATA interface 338 includes a portion of a PCB 336 that is coupled to an outer surface 303 of an enclosure 302 of data storage device 301. The portion of PCB 336 includes at least one tab that is integrally formed and extending from a main body 337 of PCB 336. It is specifically pointed out that unlike printed circuit boards of the prior art, PCB 336 is mounted on outer surface 303 of enclosure 302 such that enclosure 302 is designed to be compatible with the position of PCB 336. In addition, PCB 336 has a thickness that is larger than prior art printed circuit boards. For example, two example prior art thicknesses include 0.023 inches and 0.032 inches. PCB 336 has a thickness that can be larger than those thicknesses. Such a thickness allows PCB 336 to meet SATA connection lead dimension standards. In addition, the thickness of the at least one tab of PCB 336 can be different than a thickness of main body 337 of PCB 336.

Figure 5:
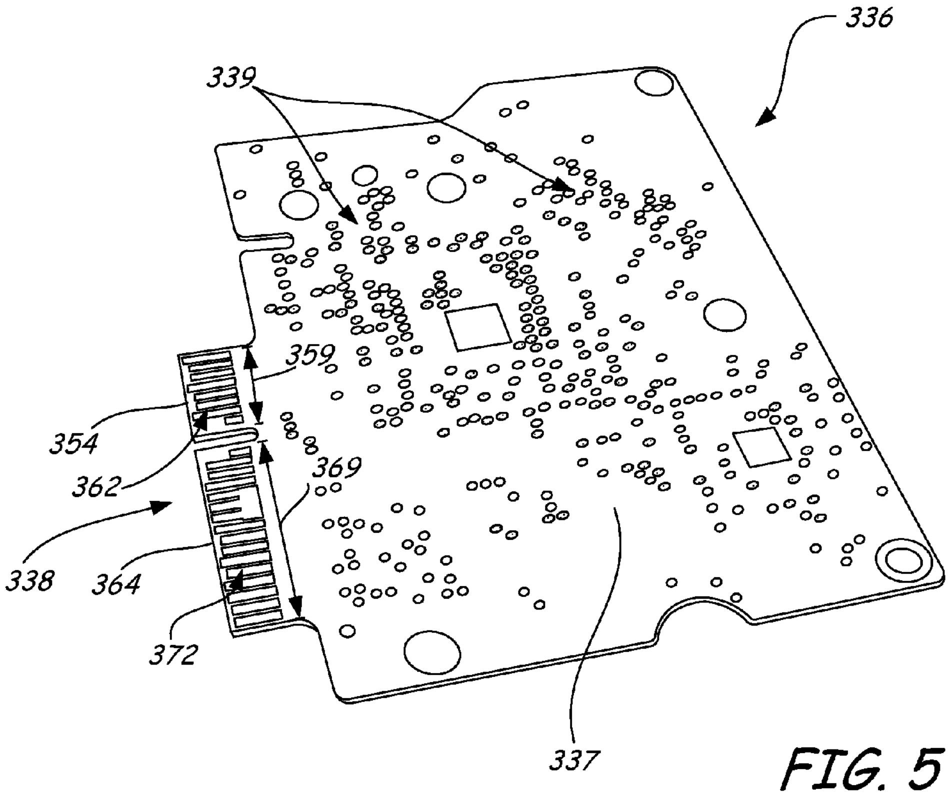
FIG. 5 is a perspective view of the PCB illustrated in FIG. 4.

FIG. 5 illustrates a more detailed view of PCB 336 including a plurality of printed circuit board components 339 that it supports and the at least one tab of SATA interface 338. Referring to both FIGS. 4 and 5, in one embodiment, the at least one tab is a signal tab 354. Signal tab 354 includes a first surface 356 and an opposing second surface 358 joined together by a peripheral edge 360. Signal tab 354 is also defined by a signal tab length 359. A plurality of signal contact pads 362 are included on first surface 356 of signal tab 354. Contact pads 362 are for conducting signals between a host device and data storage device 301 via PCB 336. In another embodiment, the at least one tab is a power tab 364. Power tab 364 includes a first surface 366 and a second surface 368 joined together by a peripheral edge 370. Power tab 364 is also defined by a power tab length 369. A plurality of power contact pads 372 are included on first surface 366 of power tab 364. Contact pads 372 are for supplying power to data storage device 301 from a host device. A gap is defined between signal tab length 359 and power tab length 369 such that a portion of peripheral edge 360 is facing a portion of peripheral edge 370.

Since the described embodiments eliminate the need for a SATA plug connector and therefore contact pads that would insure good solder joints between a connector and a PCB, contact pads 362 and 372 are designed with a more optimum width and length to achieve better signal integrity as well as better impedance. The elimination of lead pins that are found in SATA connectors eliminate physical length tolerance variations of the signal lines to ground reference as well as eliminate variations in solder joint thickness. The PCB includes improved vias that are near or in the signal tab 354 and power tab 364. The vias are formed as part of the PCB instead of in the discrete connector (for example connector 238 of FIG. 2) that is soldered to the PCB. The improved vias eliminates changes in impedence caused by a discrete connector lead. The copper inner ground plane (normally in an connector) can be further extended under pins in receptacle connector 340 to more accurately control the impedance of the connection and provide for some continuity of the cable shield onto the PCB. Contact pads 362 and 372, which are made of copper, can be formed with a variety of different types of platings and coatings since interface 338 provides a direct connection between receptacle connector 340 and PCB 336. Different types of platings and coatings are optimal for different types of applications. For example, specific materials can be used for high speed data applications, high temperature applications and etc. Some example types of platings include gold, silver and other types of electrically conductive finishes. In particular, gold plated contact pads can be used to improve high frequency performance of the signals. Organic coatings (OSP coatings) can also be used to protect and preserve copper contact pads. After applying an OSP coating, solder paste is applied to the contact pads and acts as the contact pad finish.

Referring to FIG. 4, SATA interface 338 also includes at least one keying feature that is integrally formed with an enclosure 302 of data storage device 301. The at least one keying feature is compliant with SATA standards. PCB 336 is coupled and mounted to enclosure 302. The at least one keying feature includes a first keying feature 374 and a second keying feature 376. First keying feature 374 is located proximate signal tab 354 and second keying feature 376 is located proximate power tab 364. Signal tab 354, power tab 364 and the gap defined between signal tab 354 and power tab 364 are located between first keying feature 374 and second keying feature 376.

Figure 6:
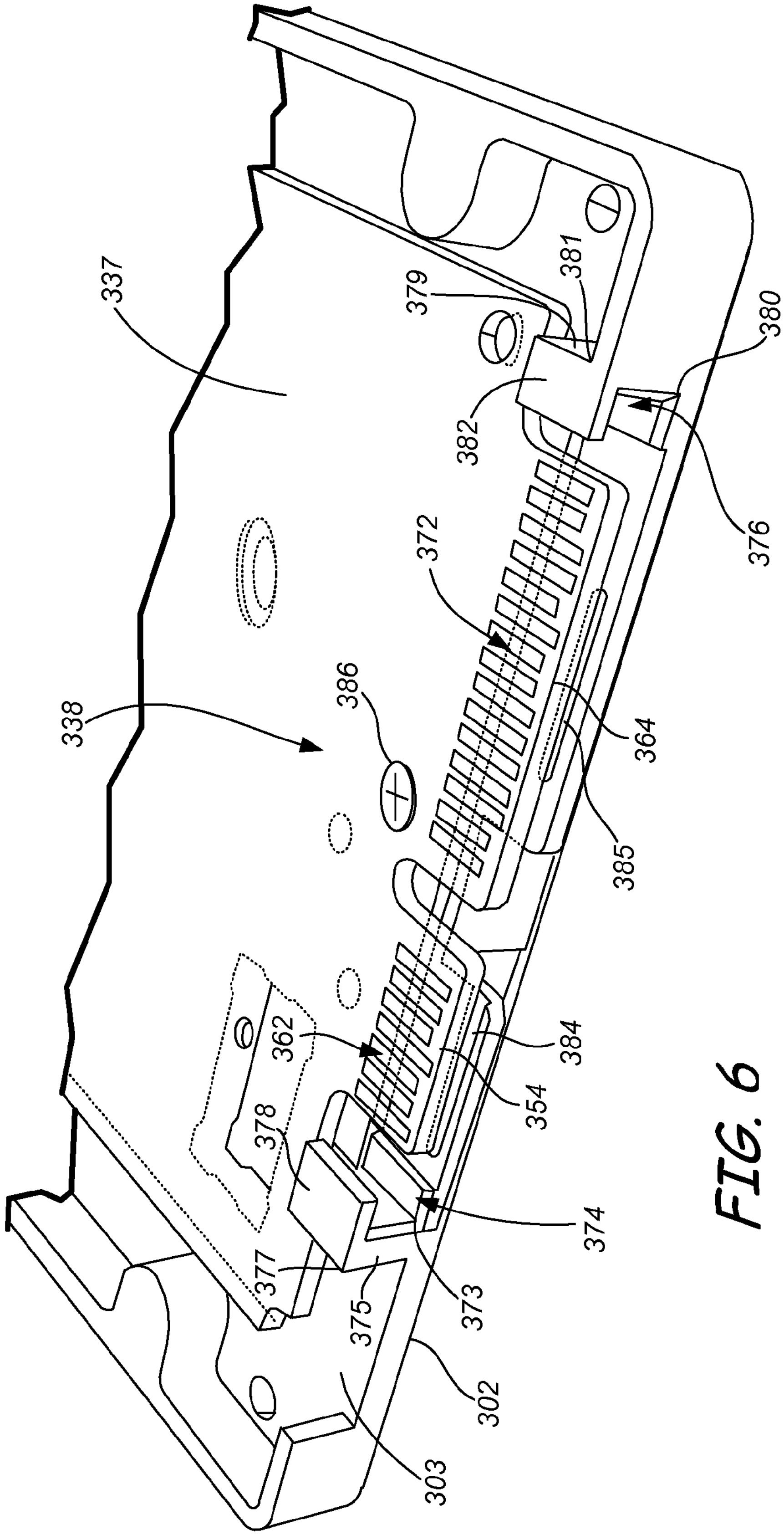
FIG. 6 is an enlarged perspective view of the SATA interface illustrated in FIG. 4.

FIG. 6 illustrates an enlarged perspective view of SATA interface 338. First keying feature 374 includes a support portion 375. Support portion 375 is formed integrally with enclosure 302 at a base end 376. Support portion 375 extends from base end 373 and beyond PCB 336 towards a distal end 377. Coupled to distal end 377 of first keying feature 374 includes a cantilevered portion 378. Cantilevered portion 378 extends perpendicularly from support portion 375 and towards signal tab 354. Second keying feature 376 also includes a support portion 379. Support portion 379 is formed integrally with enclosure 302 at a base end 380. Support portion 379 extends from base end 380 and beyond PCB 336 towards a distal end 381. Coupled to distal end 381 of second keying feature 376 includes a cantilevered portion 382. Cantilevered portion 382 extends perpendicularly from support portion 379 and towards power tab 364. First and second keying features 374 and 376 are configured to guide and support receptacle connector 340 (FIG. 4), which is coupled to a host device, into connection with the plurality of contact pads 362 and 372 (FIGS. 4 and 5) on signal tab 354 and power tab 364. In particular, support portions 375 and 379 and cantilevered portions 378 and 382 of keying features 374 and 376 are configured to receive at least a portion of a housing of the receptacle connector 340 (FIG. 4).

SATA interface 338 also includes at least one locking feature that is integrally formed with enclosure 302. The at least one locking feature is compliant with SATA standards. The at least one locking feature includes a first locking groove 384 and a second locking groove 385. Both first locking groove 384 and second locking groove 385 are located on enclosure 302 between first keying feature 374 and second keying feature 376. First locking groove 384 and second locking groove 385 are recessed into enclosure 302 of data storage device 301 (FIG. 4) from outer surface 303. First locking groove 384 is positioned on enclosure 302 proximate to where signal tab 354 of PCB 336 is located such that first locking groove 384 is between first keying feature 374 and the gap that separates signal tab 354 from power tab 364. In particular, first locking groove 384 is located at least partially under signal tab 354. Second locking groove 385 is positioned on enclosure 302 proximate to where power tab 364 of PCB 336 is located such that second locking groove 384 is between second keying feature 376 and the gap that separates power tab 356 and signal tab 354. In particular, second locking groove 385 is located at least partially under power tab 364. Locking grooves 384 and 385 are configured to receive a corresponding portion of the housing of receptacle connector 340 to secure the receptacle connector to enclosure 302.

Unlike printed circuit boards of the prior art, main body 337 of PCB 336 can accommodate at least one mounting screw 386 for mounting to enclosure 302 of data storage device 301 that is in close proximity to contact pads 362 and 372. It should be noted that even though main body 337 of PCT 336 illustrates only a single mounting screw 386, main body 337 can accommodate more than one mounting screw for mounting enclosure 302 to data storage device 301. The close proximity of at least one mounting screw 386 to contact pads 362 and 372 improves grounding between the PCB 336 and data storage device 301. Although FIG. 6 illustrates at least one mounting screw 386 positioned in close proximity to contact pads 372, it should be understood that the at least one mounting screw can be located anywhere in proximity along the signal tab length 359 (FIGS. 4 and 5) and power tab length 369 (FIGS. 4 and 5).

It is to be understood that even though numerous characteristics and advantages of various embodiments of the disclosure have been set forth in the foregoing description, this disclosure is illustrative only, and changes may be made in detail, especially in matters of structure and arrangement of parts within the principles of the disclosure to the full extent indicated by the broad general meaning of the terms in which the appended claims are expressed. For example, the particular elements may vary depending on the particular application of the top cover while maintaining substantially the same functionality without departing from the scope and spirit of the disclosure. In addition, although the embodiments described herein are directed to a base dam a disc drive, it will be appreciated by those skilled in the art that the teachings of the disclosure can be applied to other types of data storage systems, without departing from the scope and spirit of the disclosure.

What is claimed is:

1. An electronic device comprising:

an enclosure having an outer surface and configured to house components of the electronic device;

a printed circuit board positioned on the outer surface of the enclosure and supporting a plurality of printed circuit board components that are in communication with the components housed in the enclosure, the printed circuit board including at least one tab extending from a main body and having a plurality of contact pads; and wherein the enclosure comprises: at least one keying feature formed integrally with and protruding from the outer surface of the enclosure, the at least one keying feature configured to guide a receptacle connector coupled to a host device into connection with the plurality of contact pads.

2. The electronic device of claim 1, wherein the plurality of contact pads on the at least one tab of the printed circuit board comply with Serial Advanced Technology Attachment (SATA) standards.

3. The electronic device of claim 1, wherein the at least one tab of the printed circuit board comprises first and second tabs that extend from the main body of the printed circuit board, wherein the plurality of contact pads on the first tab provide data signal connection between the host device and the electronic device and the plurality of contact pads on the second tab provide power signal connection between the host device and the electronic device.

4. The electronic device of claim 1, wherein the electronic device comprises a data storage system.

5. The electronic device of claim 1, wherein the at least one keying feature comprises a support portion and a cantilevered portion that together are configured to receive at least a portion of a housing of the receptacle connector that is coupled to the host device.

6. The electronic device of claim 1, further comprising at least one locking feature formed integrally with and recessed from the outer surface of the enclosure in a direction substantially perpendicular to the at least one tab extending from the main body of the printed circuit board, each locking feature configured to secure the receptacle connector to the enclosure.

7. The electronic device of claim 1, wherein the main body of the printed circuit board comprises at least one mounting screw located proximate and along a length of the at least one tab, the at least one mounting screw is configured to mount the printed circuit board to the enclosure and electrically ground the printed circuit board to the electronic device.

8. The electronic device of claim 1, wherein the contact pads of the printed circuit board card comprise gold plating.

9. A data storage device comprising:

an enclosure having an outer surface, the enclosure configured to house data storage device components;

a printed circuit board positioned on the outer surface of the enclosure and supporting a plurality of printed circuit board components that are in communication with the data storage device components housed in the enclosure, the printed circuit board including at least one tab extending from its main body and having a plurality of contact pads; and at least one keying feature formed integrally with and protruding from the outer surface of the enclosure, the at least one keying feature configured to guide a receptacle connector coupled to a host device into connection with the plurality of contact pads.

10. The data storage device of claim 9, wherein the plurality of contact pads on the at least one tab of the printed circuit board comply with Serial Advanced Technology Attachment (SATA) standards.

11. The data storage device of claim 9, wherein the at least one tab of the printed circuit board comprises first and second tabs that extend from the main body of the printed circuit board, wherein the plurality of contact pads on the first tab provide data signal connection between the host device and the data storage device and the plurality of contact pads on the second tab provide power signal connection between the host device and the data storage device.

12. The data storage device of claim 9, wherein the at least one keying feature comprises a support portion and a cantilevered portion that together are configured to receive at least a portion of a housing of the receptacle connector that is coupled to the host device.

13. The data storage device of claim 9, further comprising at least one locking feature formed integrally with and recessed from the outer surface of the enclosure in a direction substantially perpendicular to the at least one tab extending from the main body of the printed circuit board, each locking feature configured to secure the receptacle connector to the enclosure.

14. The electronic device of claim 9, wherein the main body of the printed circuit board comprises at least one mounting screw located proximate and along a length of the at least one tab, the at least one mounting screw is configured to mount the printed circuit board to the enclosure and electrically ground the printed circuit board to the electronic device.

15. An interface that couples a host device and a peripheral device, the interface comprising:

at least one tab integrally formed and extending from a main body of a printed circuit board that is positioned on an outer surface of peripheral device, the at least one tab having a plurality of contact pads;

at least one keying feature integrally formed with and protruding from the outer surface of the peripheral device, the at least one keying feature configured to guide a receptacle connector of the host device into connection with the plurality of contact pads on the at least one tab;

at least one locking feature formed integrally with and recessed from the outer surface of the peripheral device in a direction substantially perpendicular to the at least one tab extending from the main body of the printed circuit board, the at least one locking feature configured to receive a corresponding portion on a housing of the receptacle connector to secure the receptacle connector to the at least one tab of the printed circuit board and to the peripheral device.

16. The interface of claim 15, wherein the at least one tab of the printed circuit board comprises first and second tabs that extend from the main body of the printed circuit board, wherein the plurality of contact pads on the first tab provide data signal connection between the host device and the peripheral device and the plurality of contact pads on the second tab provide power signal connection between the host device and the peripheral device.

17. The interface of claim 15, wherein the printed circuit board of which the at least one tab is integrally formed with is mounted to the outer surface of the enclosure of the peripheral device.

18. The interface of claim 15, wherein the at least one keying feature comprises a support portion and a cantilevered portion that together are configured to receive at least a portion of a housing of the receptacle connector that is coupled to the host device.

19. The interface of claim 15, wherein the contact pads on the at least one tab comprise gold plating.

20. The interface of claim 16, wherein the at least one keying feature comprises first and a second keying features and the at least one locking feature comprises first and second locking features, the first and second tabs extending from the main body of the printed circuit board being located between the first and second keying features, the first locking feature including a first locking groove recessed from the outer surface of the enclosure and between the first keying feature and a gap that separates the first tab from the second tab and the second locking feature including a second locking groove recessed from the outer surface of the enclosure and between the gap that separates the first tab from the second tab and the second keying feature.

* * * * *